(12) United States Patent
Hsu et al.

(10) Patent No.: US 7,033,892 B2
(45) Date of Patent: Apr. 25, 2006

(54) TRENCH POWER MOSFET IN SILICON CARBIDE AND METHOD OF MAKING THE SAME

(75) Inventors: Chih-Wei Hsu, Hsinchu (TW); Yung-Chung Lee, Pan Chiao (TW); Tsung-Ming Pan, Ping Tung (TW); Yen Chuo, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/952,848

(22) Filed: Sep. 30, 2004

(65) Prior Publication Data

US 2005/0266623 A1 Dec. 1, 2005

Related U.S. Application Data

(62) Division of application No. 10/425,951, filed on Apr. 30, 2003, now abandoned.

(30) Foreign Application Priority Data

Jan. 24, 2003 (TW) ............... 92101602 A (51) Int. Cl.
*H01L 21/336* (2006.01)
(52) U.S. Cl. ................... 438/270; 438/589
(58) Field of Classification Search ........... 438/270, 438/589
See application file for complete search history.

(56) References Cited

U.S. PATENT DOCUMENTS

| | | | | |
|---|---|---|---|---|
| 5,506,421 A | * | 4/1996 | Palmour | 257/77 |
| 5,915,180 A | * | 6/1999 | Hara et al. | 438/270 |
| 6,281,521 B1 | * | 8/2001 | Singh | 257/77 |
| 6,566,708 B1 | * | 5/2003 | Grover et al. | 257/330 |

* cited by examiner

*Primary Examiner*—Chandra Chaudhari
(74) *Attorney, Agent, or Firm*—Troxell Law Office, PLLC (57) ABSTRACT

A structure of accumulated type trench MOSFET in silicon carbide(SiC) and forming method are disclosed. The MOSFET includes a trench gate having a gate oxide layer, a polysilicon layer, a source region, and a drain region. The source region contains a p+ heavily doped region, an n+ heavily doped region and a p-base region, and a source contact metal layer. The p+ heavily doped region the n+ heavily doped region and the p-base region are abutting each other. The former two are extended to the front surface of the silicon carbide substrate having the source contact metal layer formed over and the latter one is beneath them. Moreover, the p-base region is separated from the trench by an accumulation channel. The drain contact metal layer is formed on the rear surface of the silicon carbide substrate where the rear region of the silicon carbide is heavily doped than the front region thereof.

7 Claims, 7 Drawing Sheets

TRENCH POWER MOSFET IN SILICON CARBIDE AND METHOD OF MAKING THE SAME

This application is a Division of application U.S. Ser. No. 10/425,951, entitled "TRENCH POWER MOSFET IN SILICON CARBIDE AND METHOD OF MAKING THE SAME" and filed on Apr. 30, 2003, now abandoned.

FIELD OF THE INVENTION

The present invention relates to a semiconductor device, specifically, to a novel termination structure for trench MOS devices so as to prevent leakage current.

BACKGROUND OF THE INVENTION

Currently, in the power transistors with breakdown voltage over 1000V market is mostly occupied by silicon base insulated gate bipolar transistor (IGBT). However, owing to the bipolar carriers characteristic of IGBT devices, the devices will suffer problems of the lifetime of the minority while turning the device off. Consequently, if it could not to add lifetime killers in the manufacture process, the system should have to tolerate the power consumption and time waste while turning off IGBT devices.

By contrast, silicon base metal oxide semiconductor field transistor features with mono-carrier species, as a result, it provides faster switch speed and less extra power consumption than those bipolar IGBTs. This is because the silicon carbide having large energy band gap of about 3.26 eV, high critical breakdown electric field intensity and high conductivity (4.9 W/cm-k) and is envisioned as an excellent material for power transistor. The power transistor based on silicon carbide can come up to a benchmark of 1000V breakdown voltage without suffering any difficulty. The breakage voltage can even come up to 5 kV if the epi-layer thickness is appropriately adjusted.

Thus, it is prone to develop silicon carbide base power transistor replaced for silicon IGBT. According to the estimation in theory, under a condition of the same breakdown voltage, the power transistor formed of silicon carbide has a Ron, sp (sheet resistance for transistor operates at a liner region) of Id vs Vd only about ½00 to ¼00 of conventional power transistor.

Figure 1A:
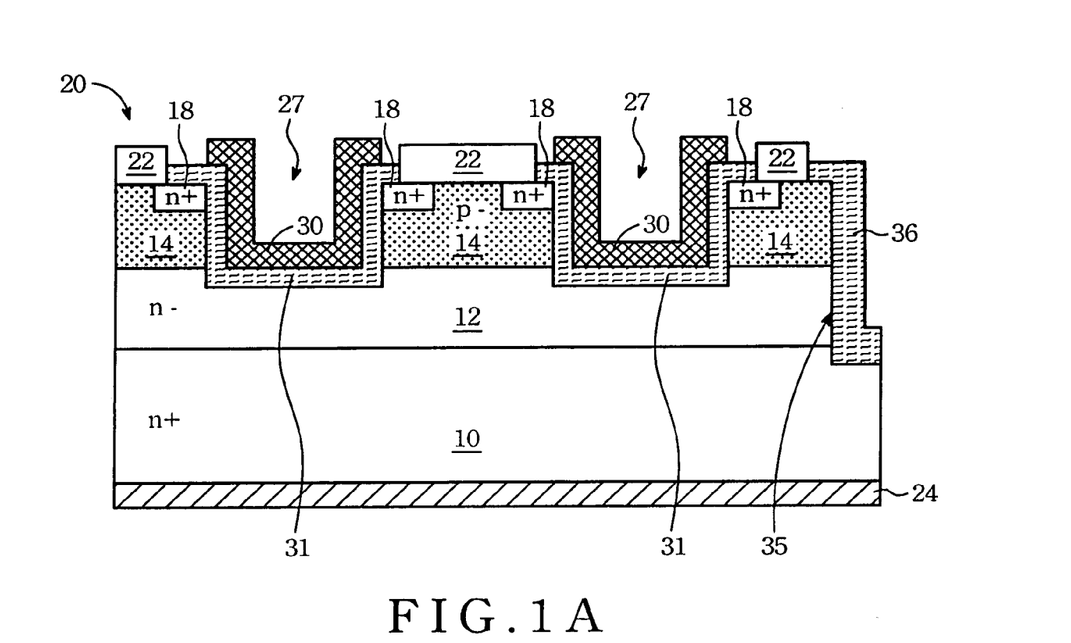
FIG. 1A is a cross-sectional view of a conventional trench MOSFET, which is an inversion type MOSFET.

For the purpose of acquiring a normal-off device, most of the conventional silicon carbide MOSFETs are operated in an inversion channel type. An example is U.S. Pat. No. 5,506,421, issued to Palmour, with a title of "Power MOSFET in Silicon Carbide." Please refer to FIG. 1A that illustrates a cross-sectional view of the silicon carbide MOSFET with an inversion channel. In this figure, a drain region consisting of a silicon carbide substrate 10 has n-type impurities in heavily doped and a drift layer 12 has lightly doped n-type impurities. A layer over the drift layer 12 is a p-type epi-layer 14. The p-type epi-layer 14 comprises trenches 27 formed therein and having trench bottoms thereof come down into the drift layer 12. An oxide layer formed on the bottoms and sidewalls of the trenches and extended to the upper surface of the p-type epi-layer 14. Poly gates with contacts 30 thereof are then formed on the gate oxide layer 31. Moreover, the source contacts 22 are formed over both he p-type epi-layer 14 and n+ doped regions 18 where the n+ doped regions 18 are formed on the two sides of each trench 27 so as to keep the source contacts 22 remain at the same voltage level. In the figure, the termination region 35 and oxide layer 36 formed thereover are shown. The deficiency of about the forgoing MOSFET is with a large $R_{ON}$,sp, the specific on-resistance in the linear operating region of the transistor while turning on.

To reduce the $R_{ON}$,sp, the MOSFET of accumulation channel type may provide a good solution. The accumulation channel make channel of the electron migration from inducing an inversion channel, where the channel is near the surface of the silicon carbide substrate turn into the interior bulk region of the silicon carbide substrate. Increasing the electron mobility and reduce the $R_{ON}$,sp, of the device are thus anticipated.

Figure 1B:
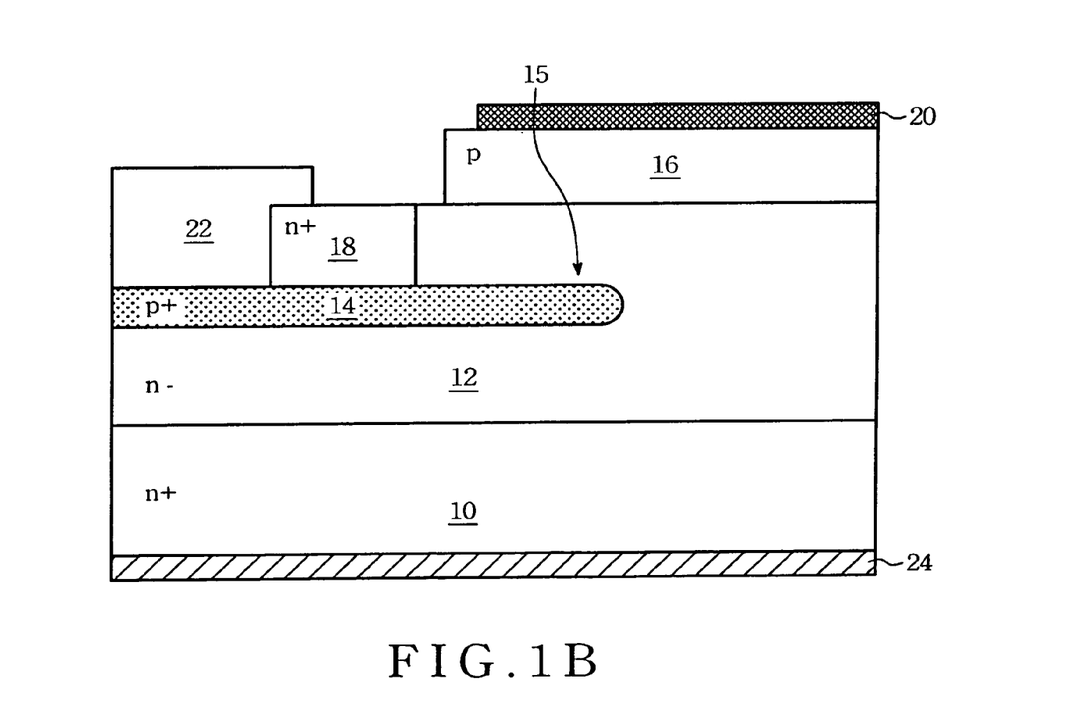
FIG. 1B is a cross-sectional view of a conventional planar MOSFET, which is an accumulation type MOSFET.

An example of accumulation channel type silicon carbide MOSFET is U.S. Pat. No. 6,281,521 with a title "Silicon Carbide Horizontal Channel Buffered Gate Semiconductor Devices" issued to Singh. The device structure of the patent proposed is shown in FIG. 1C, which is a planar device. The feature of the device is no gate oxide layer but a p-type gate layer 16 lie in between the gate contact layer 20 and the drift layer 12. The drift layer 12 is formed on the silicon carbide substrate 10. While exerting a bias voltage to the gate contact 20, an accumulation channel is formed on the upper portion of the drift layer 15. As the gate voltage is grounded, the channel presents pinch-off in between the p+ base region 14 and the gate layer. 16.

To make the transistor becoming a normally off (i.e. no gate bias voltage, no current flow occurs), the doping concentration in the drift layer 12, the p+ base region 14 and the gate layer 16 have to appropriately restricted, and so does the spacing in between the p+ base layer 14 and the gate layer 16. In the situation, the channel region 15 is completely depleted.

The proposed Singh's patent had reached the aim of decreasing Ron,sp. However, the area occupied for a planar MOSFET is larger than for a typical trench MOSFET.

The motivation of the present invention is thus to propose a trench MOSFET of accumulation channel type so as to increase the electron mobility and thus reduce the Ron,sp.

SUMMARY OF THE INVENTION

The present invention discloses a structure of an accumulation channel type trench MOSFET in silicon carbide (SiC) and a method of making the same. The MOSFET includes a trench gate having a gate oxide layer, a polysilicon layer, a source region, and a drain region. The source region contains a p+ heavily doped region, an n+ heavily doped region and a p-base region, and a source contact metal layer. The p+ heavily doped region, the n+ heavily doped region, and the p-base region are abutting each other. The former two are extended to the front surface of the silicon carbide substrate having the source contact metal layer formed over and the latter one is beneath them.

Moreover, the p-base region is separated from the trench by an accumulation channel. The drain contact metal layer is formed on the rear surface of the silicon carbide substrate where the rear region of the silicon carbide substrate is more heavily doped than the front region thereof.

The method comprises: at first, an n-type heavily doped silicon carbide substrate having an n-type drift layer formed thereon is provided. Then, a first photoresist pattern having openings to define p-base regions is formed. Thereafter, a first ion implant is carried out to form the p-base regions in the drift layer. After removing the first photoresist pattern, a second ion implant is carried out to form an n-type heavily doped layer in the drift layer and extended to an outer surface of the drift layer. Next, a trench is formed in the drift layer and in between the p-base regions through lithography and an etching process. The trench is separated from the p-base regions by an accumulation channel width. Subsequently, a gate oxide layer over all surfaces is performed. A polycrystalline silicon layer is then refilled the trench and formed on all surface of the SiC substrate. The polycrystalline silicon layer is then patterned to form a trench polygates. Afterward, a second photoresist pattern is formed to define p-type heavily doped regions. A third ion implant is then conducted to form p-type heavily doped regions which are extended to the surface of the drift layer and is abutting remnant n-type heavily doped layer and over the p-base region. The second photoresist pattern is then stripped. Next, an insulating layer over all exposed surface is formed. Then a patterning step is done to define a capping layer over the trench polygate and a portion of n-type heavily doped layer and to define a poly-gate contact. A thermal anneal to activate all ions doped is then performed. Thereafter, a first metal layer atop front surface of the silicon carbide substrate is formed. The first metal layer is then patterned to form a source contact metal layer and a trench polygate contact metal layer. All layers formed on a rear surface of the silicon carbide substrate are removed. Finally, a second metal layer on the rear surface is formed and functions as a drain electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2I is a schematic topographic diagram of trench MOSFET in accordance with the present invention.

DETAILED DESCRIPTION OF THE PREFERRED EMBODIMENT

The method of forming trench metal oxide transistor according to the present invention is shown in cross-sectional views from FIG. 2A to FIG. 2H.

Figure 2A:
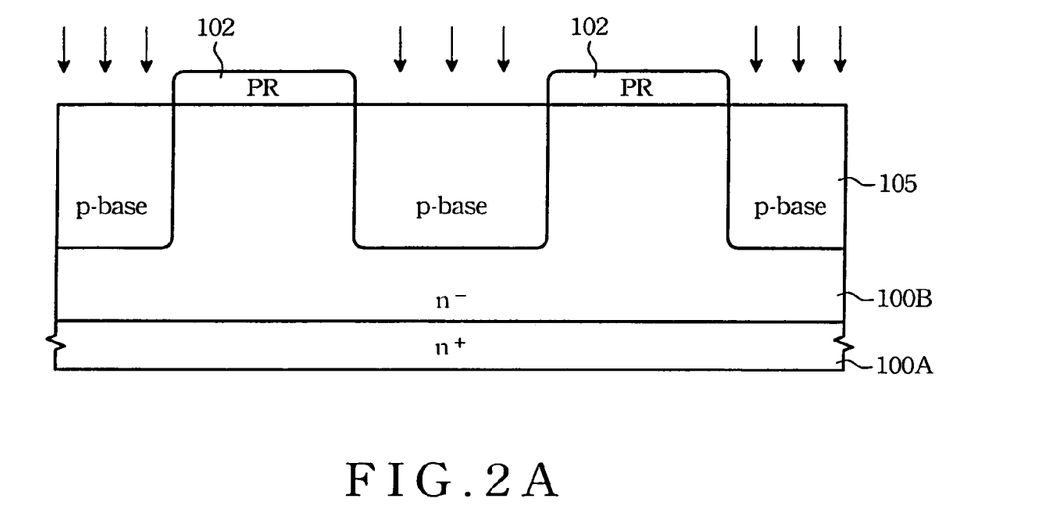
FIG. 2A is a cross-sectional view of forming p-base regions in the drift layer formed by selecting implant in accordance with the present invention.

Referring to FIG. 2A, an n-type impurity doped silicon carbide substrate 100A having an impurity doped silicon carbide epi-layer 100B formed thereon is prepared. The epi-layer 100B functions as drift layer 100B. A photoresist pattern 102 is then formed on the epi-layer 100B to define p-base regions 105. Thereafter, a first ion implant is carried out to implant p-type ions into epi-layer 100b so as to form p-base regions 105, using the photoresist pattern 102 as a mask. The p-type ions can be selected from aluminum or $BF_2^+$ ions. The p-base regions 105 are between about 0.8 to 5.0 μm in depth. In general, the diffusion length of the impurities in silicon substrate is much shorter than in silicon substrate during ion activation process. Therefore, the p-base region 180 is formed by multiple implants with different implant energies so as to uniform distribution the impurities.

Figure 2B:
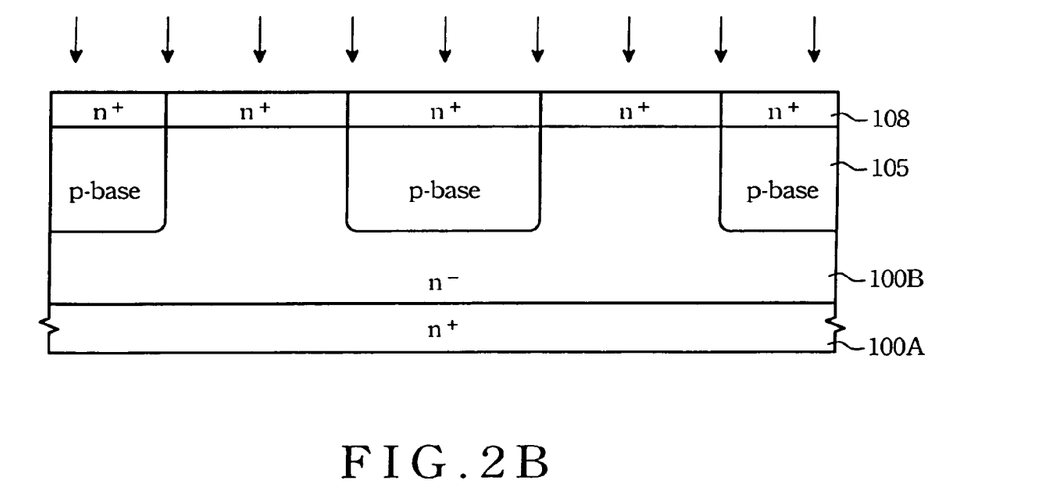
FIG. 2B is a cross-sectional view of forming an n-type heavily doped layer in the drift layer by blanket implant in accordance with the present invention.

Turning to FIG. 2B, after stripping photoresist pattern 102, a second and blanket ion implantation implants the epi-layer 100b with n-type ions to form an n+ heavily doped layer 108. The n+ heavily doped layer 108 has a much shallower junction than p-base regions 105.

Figure 2C:
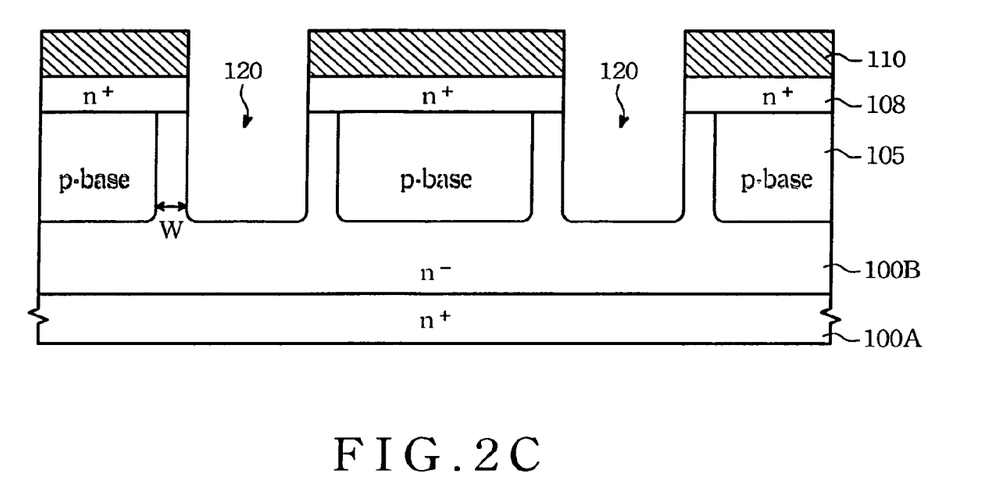
FIG. 2C is a cross-sectional view of forming a trench in the drift layer by selected etching in accordance with the present invention.

Referring to FIG. 2C, a hard mask layer formed of metal or oxide 110 is formed on the epi-layer 100B through a lithographic and an etch step. The hard mask layer 110 is to defined trenches 120. The silicon carbide epi-layer 100B is then patterned to form trenches 120 using the hard mask 110 as an etch mask. The trenches 120 have a bottom depth value about the same as the bottom of the p-base regions 105. Worthy to note, the trenches 120 are spaced from the p-base regions 105 by spacing with a width value W. The spacing in between the p-base regions 105 and trenches 120 functions as an accumulation channel.

Figure 2D:
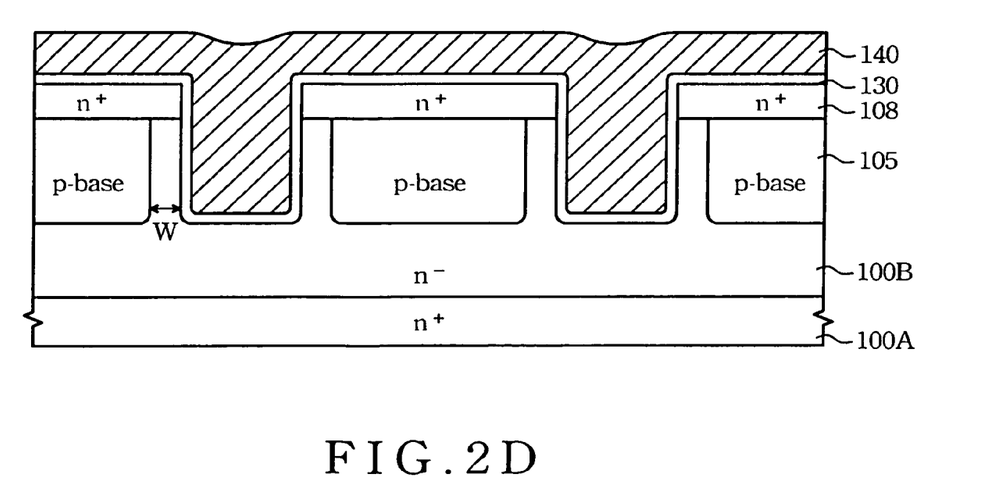
FIG. 2D is a cross-sectional view of refilling the trench with a polysilicon layer in accordance with the present invention.

Please refer to FIG. 2D, after the hard mask or the photoresist pattern 110 removal, a gate oxide layer 130 is formed on a bottom and sidewalls of each trench 120 and extended to all surfaces of the epi-layer 100B. The gate oxide layer 130 is a HTO layer formed by thermal deposition or a thermal oxide layer formed by thermal oxidation or a poly-oxide layer by polysilicon deposition and re-oxidation. Preferably, the gate oxide layer 130 is between about 50–200 nm. Afterward, a polycrystalline silicon layer 140 is deposited on all surfaces and filled in the trenches 120 by low-pressure chemical vapor deposition (LPCVD) in the meanwhile. The polycrystalline silicon layer 140 is doped through an in-situ doped process or by POCL3 diffusion after deposition.

Figure 2E:
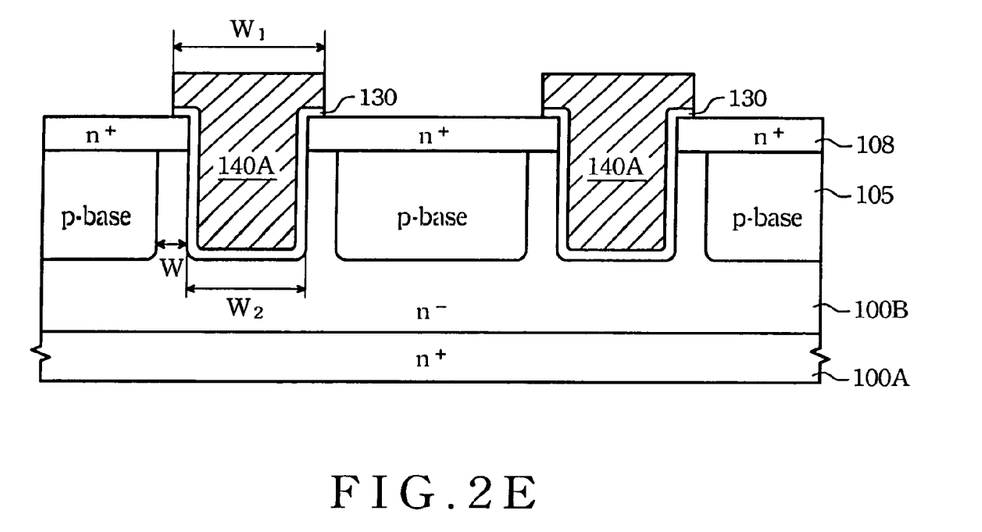
FIG. 2E is a cross-sectional view of defining the trench gate in accordance with the present invention.

Referring to FIG. 2E, the polycrystalline silicon layer 140 is then patterned to form trench polygates 140A using a lithographic step and an etch process. The trench polygates 140A have a width W1 larger than the trench width W1 for a purpose of easier to form trench gate contact.

Figure 2F:
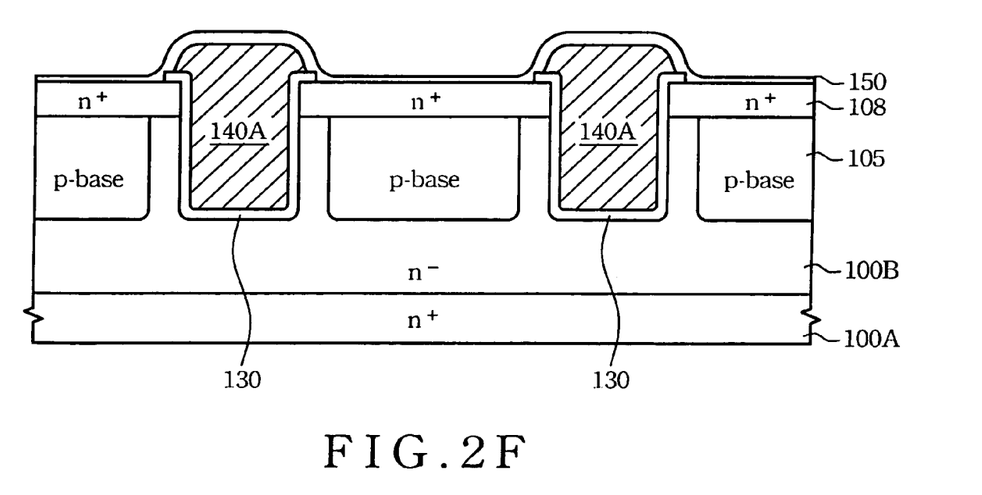
FIG. 2F is a cross-sectional view of forming a thin poly-oxide layer by thermal oxidation in accordance with the present invention.

Referring to FIG. 2F, a thermal oxidation process is then conducted to form an oxide layer on and enclosed the trench polygates 140A. Certainly, a thinner oxide layer is formed on the surface of silicon carbide substrate 100 to increase the thickness of the gate oxide layer 130.

Figure 2G:
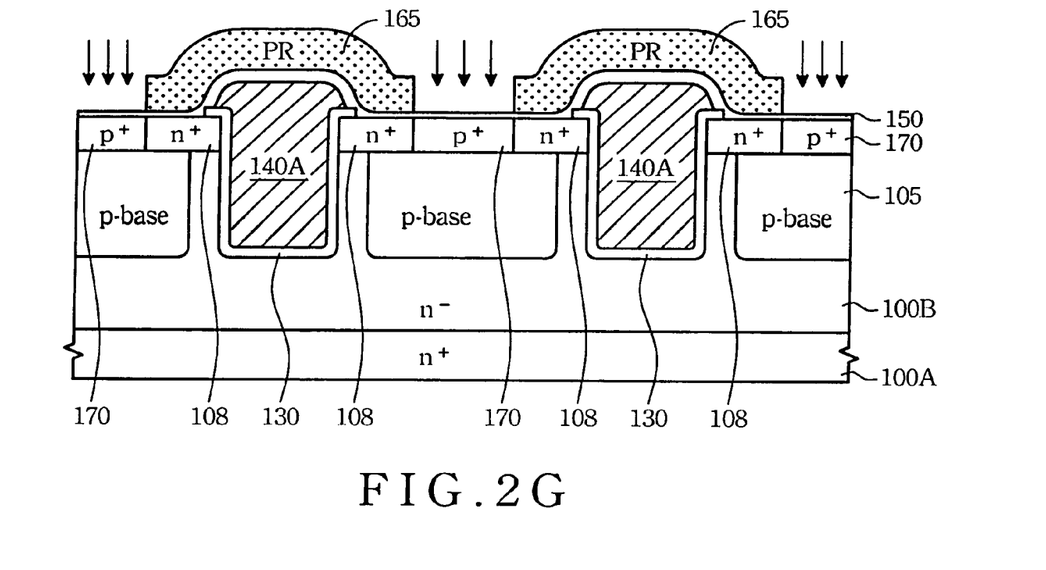
FIG. 2G is a cross-sectional view of forming an insulating layer capping the trench gate and a portion of n-type heavily doped layer in accordance with the present invention.

FIG. 2G illustrates a cross-sectional view. A photoresist pattern 165 is formed on the resulted surface to define p+ heavily doped regions 170. A third ion implantation is then carried out to implant p-type ions into n+ heavily doped layer 108 so as to form p+ heavily doped regions 170 using the photoresist pattern 165 as a mask. Certainly, the dosage of the third ion implant is much heavier than the second ion implant dosage. For example, the dosage for p+ heavily doped regions 170 may be double than that of prior implant for n+ heavily doped layer 108 since it requires an electrical compensation with the n+ ions. Moreover, the p+ heavily doped regions 170, n+ heavily doped layer (herein it become regions 108). And the p-base regions 105 are abutting each other so that if a voltage exerted on the source contact, the three regions are at the same voltage level.

Figure 2H:
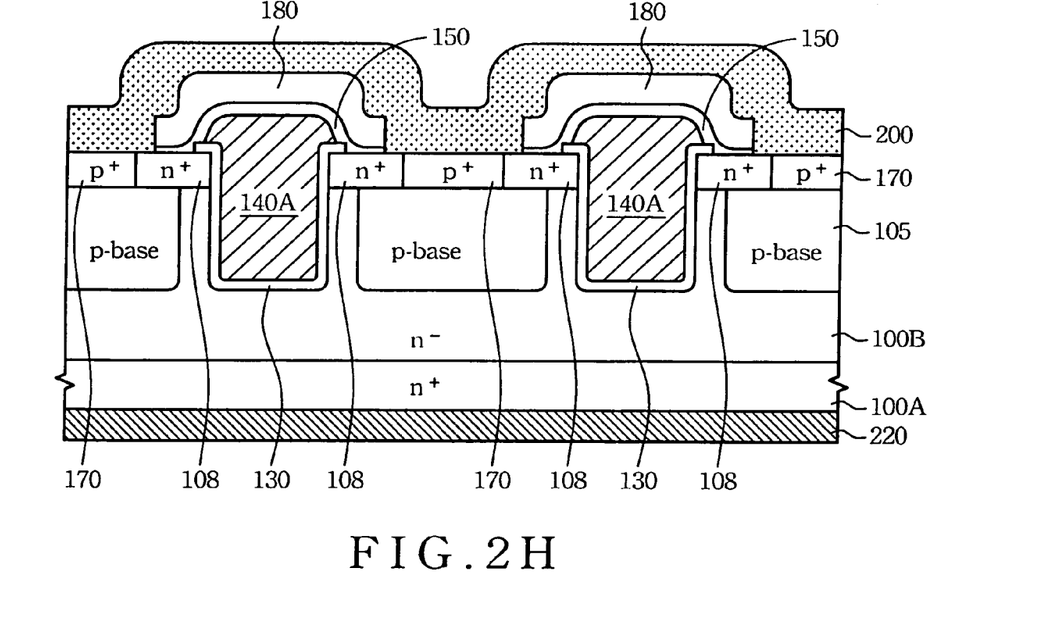
FIG. 2H is a cross-sectional view of forming a source contact metal layer and poly contact metal layer and drain contact metal layer in accordance with the present invention.

Please refer to FIG. 2H, the photoresist pattern 165 is removed. Then a dielectric layer 180 having a thickness of about 0.3–1.0 µm is formed over all surfaces. Afterward, a conventional deposition, lithography and etch steps and photoresist pattern stripping are successively followed to form an insulating layer capping the trench polygates and a portion of n+ heavily doped region 180 and form a polygates contact where the polygates contact is near the termination region by patterning the dielectric layer 180. The dielectric layer 180 may be a TEOS layer or other oxide layer.

Thereafter a thermal process is carried out at a temperature of about 1400–1600° C. for a half hour to 2 hours to activate the conductive impurities. A metal layer is then deposited on the front surface of epi-layer 100B by sputtering. A patterning process by using a lithography and an etch process are then done to form a source contact metal layer 200 on the p+ heavily doped regions 170, n+ heavily doped regions 108 and the insulating layer 180 and form a polygates gate contact metal layer 210 to contact polygates contact.

Still referring to FIG. 2H, before forming a drain metal layer, the layers formed over a rear surface of the silicon carbide 100A are removed firstly. For example the removal may be done by using CMP (chemical/mechanical polishing) until the surface of the silicon carbide substrate 100B is exposed or even more thinning the silicon carbide substrate. Finally, a second metal layer 220 on the rear surface is deposited. The second metal layer is functioned as a drain electrode 220.

The schematic topographic diagram of the devices according the present invention is shown in FIG. 2I.

The aforementioned device according to the present invention is an accumulation channel type MOSFET. The accumulation channel is abutting the sidewall of the trench polygate. Generally, the device with accumulation channel belongs to a normally-on type. That is a current flow will be found if there is a positive voltage drop in between the drain electrode and the source electrode even the gate voltage is zero. The device desired as depicted before aims at a normally-off device. Since silicon carbide has a larger energy band gap than silicon, the depleted region of device made of the silicon carbide is thus much larger than that of silicon. And thus easier to make the accumulation channel completely depleted while the gate voltage is grounded electrically. According to a preferred embodiment, a ratio of concentration in the p-base region 105 over the n-drift epi-layer 100B is controlled at a range between about $10^{15}:10^{12}$ to $10^{18}:10^{15}$ and the accumulation channel is about 0.1–0.8 µm.

The electrons flow in accumulation channel will attract more and more electron if the gate voltage is positive and has a positive voltage difference between drain electrode and source electrode. Since electrons are majority while they move in the accumulation channel, as a result, the electron mobility decrease is thus alleviated due to less collision. In the situation of high electron mobility, low Ron,sp is thus anticipated.

Figure 3:
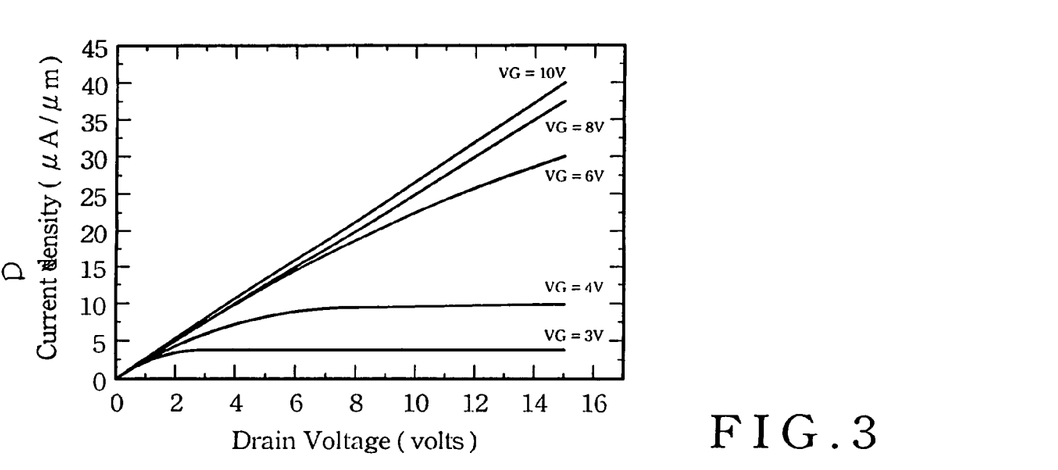
FIG. 3 shows a simulation result of Id-Vd relationship diagram in accordance with the trench MOSFET proposed by the present invention.
Figure 4:
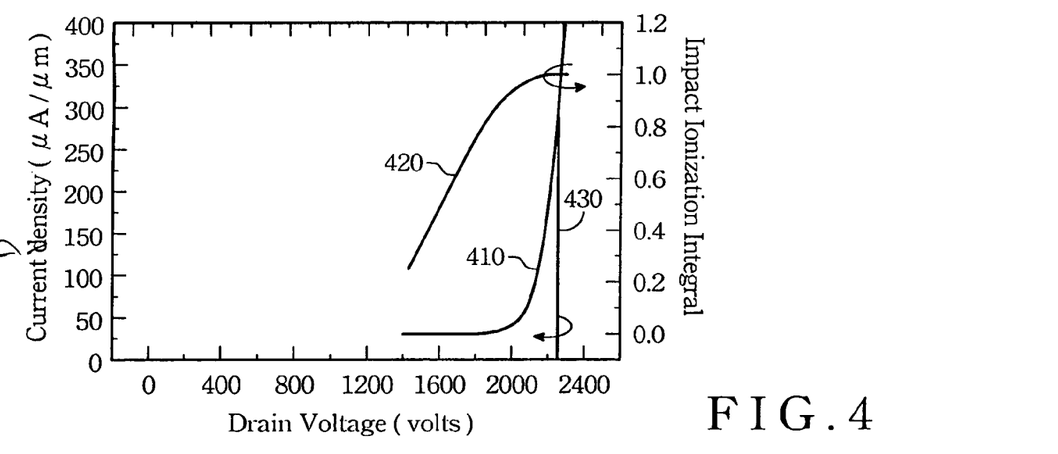
FIG. 4 shows a simulation result of blocking performance of the trench MOSFET of the present invention.
Figure 5:
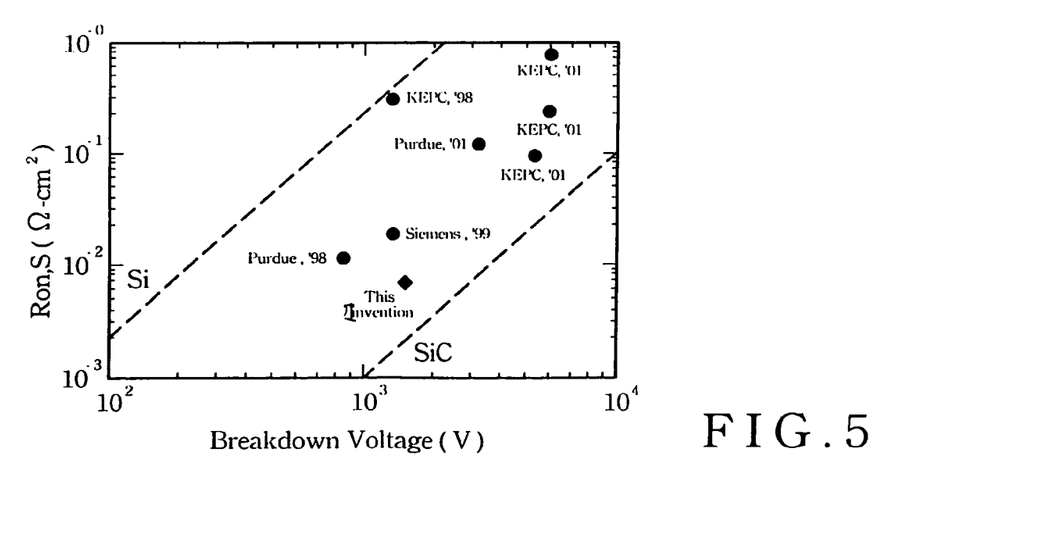
FIG. 5 shows a comparison for breakdown voltages, Ron,sp of the device, and the invention with devices proposed by other countries' researching laboratories.

FIG. 3 to FIG. 5 show electrical performance simulation results of the device according to the present invention. The simulation proceeding is in accordance with the following conditions: the trench width and depth, are both 2 µm, the ratio of impurity concentration in p-base over in n-drift layer is $10^{18}$ cm$^{-3}$:$10^{15}$ cm$^{-3}$. The accumulation channel width is 0.3–0.5 µm and the source voltage VSS=0V.

FIG. 3 shows relation curve of drain current versus drain voltage (Id-Vd). The result shows Ron,sp=11 mΩ-cm$^2$ as VG=VD=10V.

FIG. 4 shows simulation results of blocking performance of the device. The curves 410, 420, and 430 are respectively, of electron impact ionization integral versus Vd, hole impact Ionization integral versus Vd, and leakage current during reverse bias. The VG (gate voltage)=VSS=0. The figure shows electron impact ionization drastically increase as Vd=2,100V and reaches an ultimate value ionization integral=1 while Vd=2,200V. It represents the breakdown voltage of the device is 2,200V. On the contrary, the hole impact ionization drastically increase at Vd=1,800V. However, the curve 430 almost attaches to the horizontal axis. It indicates almost free of leakage current until reaching breakdown voltage, Vd=2,200 V.

FIG. 5 shows a comparison for breakdown voltage and Ron,sp of the device the invention proposed with devices proposed by researching laboratories of other countries. Although the breakdown voltage of the device, the invention proposed is lower than that of KEPC proposed (2200V vs. 6000V), however, among all of the devices, the invention provides lowest Ron,sp. It implies that the heat generated of the device is lowest and thus it provide most stable electron mobility while comparing with the others. In views of the characteristic of silicon carbide, and for Ron,sp=$10^{-2}$ Ω-cm$^2$ is concerned, the device of the present invention proposed is the one whose voltage is the most approaching the theories. In fact, 2,200 V breakdown voltage is enough to satisfy most of applications.

The benefits of this invention are as follows:

The device provides high breakdown voltage and lower Ron,sp and thus electron mobility performance can keep above a mean level.

The leakage current problem is not occurred although it is an accumulation channel type. And the device is a normally-off device too.

As is understood by a person skilled in the art, the foregoing preferred embodiment of the present o invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A method of forming trench MOSFET device, the method comprising the steps of:

providing an n-type heavily doped silicon carbide substrate having an n-type drift layer formed thereon;

forming a first photoresist pattern having openings to define p-base regions on said drift layer;

performing a first ion implant to form said p-base regions in said drift layer using said first photoresist pattern as a mask;

removing said first photoresist pattern;

performing a second ion implant to form an n-type heavily doped layer in said drift layer and extended to a surface of said drift layer;

forming a trench in said drift layer in between said p-base regions through a lithography and an etching process, wherein said trench separated from said p-base regions by an accumulation channel width;

forming a gate oxide layer over all surfaces of said drift layer;

forming a polycrystalline silicon layer on said gate oxide layer, and refilling said trench;

patterning said polycrystalline silicon layer to form a trench polygate;

forming a second photoresist pattern on said drift layer whose openings define p-type heavily doped regions;

performing a third ion implant to form p-type heavily doped regions in said n-type heavily doped layer and extended to said surface of said drift layer using said second photoresist pattern as a mask, wherein each p-type heavily doped region is doped with around double p-type impurity concentration than n-type impurity concentration in said n-type heavily doped layer so that each p-type heavily doped region is thus abutting remnant n-type heavily doped layer and over one of said p-base regions;

removing said second photoresist pattern;

forming an insulating layer over all exposed surface of said drift layer;

patterning said insulating layer to define a capping layer over said trench polygate and a portion of n-type heavily doped layer and to define a poly-gate contact;

performing a thermal anneal to activate all ions doped;

forming a first metal layer atop front surface of said silicon carbide substrate;

patterning said first metal layer to form a source contact metal layer on said insulating layer, p-type heavily doped regions and said and n-type heavily doped layer and form a trench polygate contact metal layer on said poly-gate contact;

removing all layers formed on a rear surface of said silicon carbide substrate until said silicon carbide substrate is exposed; and forming a second metal layer on said rear surface to be as a drain electrode.

2. The method of claim 1 wherein said trench is of about 0.8–5.0 μm in depth, and said gate oxide layer is of about 50–200 nm.

3. The method of claim 1 wherein said n-type impurities are nitrogen ions and said p-type impurities are selected from aluminum ion or $BF_2^+$.

4. The method of claim 1 wherein said step of performing a thermal anneal is carried out at a temperature of 1400–1600° C.

5. The method of claim 1 and further comprising performing a thermal oxidation to oxidize said polycrystalline silicon layer after forming a trench polygate.

6. The method of claim 1 wherein said insulating layer is a TEOS layer having a thickness of about 0.3–1.0 μm.

7. The method of claim 1, post the step of forming drain contact further comprising a step of performing a thermal anneal to form ohmic contacts for said source contacts and said drain contact.

* * * * *